(12) United States Patent
Matsui

(10) Patent No.: US 7,998,525 B2
(45) Date of Patent: Aug. 16, 2011

(54) METHOD OF MANUFACTURING ELECTRODE SUBSTRATE FOR PHOTOELECTRIC CONVERSION ELEMENT OF DYE-SENSITIZED CELL

(75) Inventor: Hiroshi Matsui, Kohtoh-ku (JP)

(73) Assignee: Fujikura Ltd., Tokyo (JP)

( * ) Notice: Subject to any disclaimer, the term of this patent is extended or adjusted under 35 U.S.C. 154(b) by 57 days.

(21) Appl. No.: 12/273,380

(22) Filed: Nov. 18, 2008

(65) Prior Publication Data

US 2009/0133743 A1    May 28, 2009

Related U.S. Application Data

(63) Continuation of application No. PCT/JP2007/060131, filed on May 17, 2007.

(30) Foreign Application Priority Data

May 19, 2006    (JP) ................................. 2006-140258

(51) Int. Cl.
*B05D 5/12*    (2006.01)

(52) U.S. Cl. ........................ 427/58; 427/108; 427/126.2

(58) Field of Classification Search .................... 427/58, 427/108, 126.2
See application file for complete search history.

(56) References Cited

U.S. PATENT DOCUMENTS

| 5,084,365 A | 1/1992 | Gratzel et al. |
| 2002/0017864 A1 | 2/2002 | Watanabe et al. |
| 2006/0038228 A1* | 2/2006 | Aitken et al. ................. 257/347 |
| 2006/0162770 A1 | 7/2006 | Matsui et al. |

FOREIGN PATENT DOCUMENTS

| CN | 1236481 A | 11/1999 |
| CN | 1703801 | * 11/2005 |
| CN | 1703801 A | 11/2005 |
| JP | 1-220380 A | 9/1989 |
| JP | 2003-203681 A | 7/2003 |
| JP | 2005-078857 A | 3/2005 |
| JP | 2005078857 | * 3/2005 |
| JP | 2005-103754 A | 4/2005 |
| JP | 2005-290153 A | 10/2005 |
| JP | 2006-107892 A | 4/2006 |
| WO | 9820524 A1 | 5/1998 |

OTHER PUBLICATIONS

Graetzel, M. et al. Nature, United Kingdom, Oct. 24, 1991, vol. 353, pp. 737-740.

* cited by examiner

*Primary Examiner* — Brian K Talbot
(74) *Attorney, Agent, or Firm* — Sughrue Mion, PLLC

(57) ABSTRACT

The present invention relates to a method of manufacturing an electrode substrate that has a base substrate made of glass having a strain point of 520° C. or higher, a transparent conductive layer formed on the base substrate, a metal wiring layer, and an insulating layer made of low-melting glass that covers the metal wiring layer, the metal wiring layer and the insulating layer being provided on the transparent conductive layer, the method including at least the steps of providing paste that forms a base material of the low-melting glass so as to cover the metal wiring layer; and forming the insulating layer by sintering the paste by means of a heat treatment.

4 Claims, 2 Drawing Sheets

METHOD OF MANUFACTURING ELECTRODE SUBSTRATE FOR PHOTOELECTRIC CONVERSION ELEMENT OF DYE-SENSITIZED CELL

TECHNICAL FIELD

The present invention relates to an electrode substrate that is favorably used for a photoelectric conversion element or the like such as a dye-sensitized solar cell, and specifically relates to a method of manufacturing an electrode substrate that can reliably perform shielding of a metal wiring layer and has low resistance.

Priority is claimed on Japanese Patent Application No. 2006-140258, filed May 19, 2006, the content of which is incorporated herein by reference.

BACKGROUND ART

Dye-sensitized solar cells, developed by the Swiss researcher Michael Graetzel, are a new type of solar cell attracting attention for their high photoelectric conversion efficiency and low manufacturing cost (for example, refer to Patent Document 1 and Non-Patent Document 1).

A dye-sensitized solar cell is provided with: a working electrode having an oxide semiconductor porous film, on which a sensitizing dye made of oxide semiconductor fine particles is adsorbed, on an electrode substrate; a counter electrode that is provided so as to face this working electrode; and a electrolyte layer that is formed by an electrolyte solution being filled between the working electrode and the counter electrode.

In this type of dye-sensitized solar cell, the oxide semiconductor fine particles are sensitized by a sensitizing dye that absorbs incident light such as sunlight, with an electromotive force being generated between the working electrode and the counter electrode. Thereby, the dye-sensitized solar cell functions as a photoelectric conversion element that converts light energy into electrical power (for example, refer to Patent Document 1 and Non-Patent Document 1).

A transparent electrode substrate that is used in the above-described dye-sensitized solar cell is generally made by covering a substrate surface with a transparent conductive film of tin-doped indium oxide (ITO), fluorine-doped tin oxide (FTO), or the like. However, the specific resistance of ITO or FTO is of the order of $10^{-4}$ to $10^{-3} \Omega \cdot cm$, which is a value approximately 100 times greater than the specific resistance of metal such as silver or gold. Therefore, especially when ITO or FTO is used for cells having a large surface area, this can be a cause of reducing the photoelectric conversion efficiency.

One technique of lowering the resistance of transparent electrode substrate is to increase the thickness of the transparent conductive film (such as the ITO or FTO). However, when forming the film to such a thickness that the resistance value is sufficiently lowered, the photoabsorption by the transparent conductive layer increases. For that reason, since the transmission efficiency of incident light markedly falls, a reduction in the photoelectric conversion efficiency easily occurs.

As a solution to this problem, investigations are currently underway into lowering the resistance of the electrode substrate by providing a metal wiring on the surface of the transparent electrode substrate to an extent that does not markedly impair the opening area ratio (for example, refer to Patent Document 2). In this case, in order to prevent corrosion of the metal wiring by the electrolyte solution and leak current from the metal wiring to the electrolyte solution, it is necessary for at least the surface portion of the metal wiring to be protected by a shielding layer. This shielding layer is required to cover the wiring board densely and have excellent chemical resistance to the electrolyte solution and the like that constitutes the electrolyte layer. Materials that satisfy these requirements include insulating resin, glass and the like. However, due to cases of the substrate being subjected to a thermal history such as when forming the oxide semiconductor porous film, it is preferable to use glass, which has greater heat resistance than insulating resin.

[Patent Document 1] Japanese Unexamined Patent Application, First Publication No. H01-220380
[Patent Document 2] Japanese Unexamined Patent Application, First Publication No. 2003-203681
[Non-Patent Document 1] Graetzel, M. et al, Nature, United Kingdom, 1991, vol. 353, p. 737.

However, in the case of using glass as a shielding layer, it is difficult to form a shielding layer with excellent denseness, and it is sometimes impossible to sufficiently prevent corrosion of the metal wiring by the electrolyte solution and leak current from the metal wiring to an electrolyte solution.

The present invention was made in view of the above circumstances, and has an object of providing a method of manufacturing an electrode substrate that can reliably perform shielding of a metal wiring layer and has low resistance. Also, the present invention has an object of providing a photoelectric conversion element that has an electrode substrate obtained by using the method of manufacturing an electrode substrate and is favorably used for a solar cell.

DISCLOSURE OF THE INVENTION

A method of manufacturing an electrode substrate according to the present invention relates to a method of manufacturing an electrode substrate that has a base substrate made of glass having a strain point of 520° C. or higher, a transparent conductive layer formed on the base substrate, a metal wiring layer, and an insulating layer made of low-melting glass that covers the metal wiring layer, the metal wiring layer and the insulating layer being provided on the transparent conductive layer, the method including: a step of providing a paste that forms a base material of the low-melting glass so as to cover the metal wiring layer; and a step of forming the insulating layer by sintering the paste by means of a heat treatment.

In this method of manufacturing an electrode substrate, it is preferable that the heat treatment be performed at a temperature that is lower than the strain point of the base substrate.

In this method of manufacturing an electrode substrate, it is preferable that the heat treatment be performed at a temperature that is 20° C. or more lower than the strain point of the base substrate.

An electrode substrate according to the present invention is manufactured by the aforementioned methods of manufacturing an electrode substrate.

A method of evaluating an electrode substrate according to the present invention relates to a method of evaluating an electrode substrate that has a base substrate made of glass having a strain point of 520° C. or higher, a transparent conductive layer formed on the base substrate, a metal wiring layer, and an insulating layer made of low-melting glass that covers the metal wiring layer, the metal wiring layer and the insulating layer being provided on the transparent conductive layer. This method includes: a step of disposing an evaluation substrate with an electrode formed on the surface thereof and the electrode substrate so that the electrode of the evaluation substrate and the insulating layer of the electrode substrate face each other, and filling an electrolyte between the evaluation substrate and the electrode substrate; a step of connecting an electric current measuring device that is capable of measuring current between the electrode of the evaluation substrate and the electrode substrate and observing the flowing current for a predetermined time; a step of disposing the evaluation substrate and an inspection substrate which is an electrode substrate in which the metal wiring layer is not provided or an electrode substrate in which the metal wiring layer and the insulating layer are not provided, so as to face each other and filling an electrolyte between the inspection substrate and the evaluation substrate; a step of connecting the electric current measuring device between the inspection substrate and the evaluation substrate and observing the flowing current for the same time as the time of observing the current using the electrode substrate; and a step of, upon defining the amount of current that is observed using the electrode substrate as A and defining the amount of current that is observed using the inspection substrate as B, judging the insulating layer as being dense when a value obtained by dividing A by B is 100 or less.

An electrode substrate according to the present invention relates to an electrode substrate that has a base substrate made of glass having a strain point of 520° C. or higher, a transparent conductive layer formed on the base substrate, a metal wiring layer, and an insulating layer made of low-melting glass that covers the metal wiring layer, the metal wiring layer and the insulating layer being provided on the transparent conductive layer. In this electrode substrate, the behavior of current that flows through the electrode substrate in the state of the insulating layer being in contact with an electrolyte solution is stable.

A photoelectric conversion element according to the present invention has the aforementioned electrode substrate.

A dye-sensitized solar cell according to the present invention is made of the aforementioned photoelectric conversion element.

EFFECT OF THE INVENTION

The present invention relates to a manufacturing method of an electrode substrate that has a base substrate made of glass having a strain point of 520° C. or higher, a metal wiring layer, and an insulating layer made of low-melting glass that covers the metal wiring layer, the metal wiring layer and the insulating layer being provided on the base substrate, in which the insulating layer is formed by sintering a paste with heat treatment. As a result, it is possible to reliably perform shielding of the metal wiring layer with a dense low-melting glass that is sintered.

DESCRIPTION OF REFERENCE NUMERALS

Figure 1:
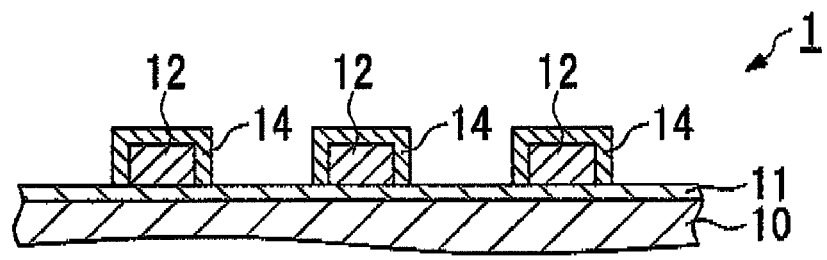
FIG. 1 is a cross-sectional view of a first example of an electrode substrate of the present invention.

1: Electrode substrate
2: Oxide semiconductor porous film
3: Working electrode
4: Counter electrode
5: Charge transfer layer
6: Photoelectric conversion element
10: Base substrate
11: Transparent conductive layer
12: Metal wiring layer
13: Shielding layer
14: Insulating layer

BEST MODE FOR CARRYING OUT THE INVENTION

The preferred embodiment of the present invention will be described below with reference to the drawings.

FIG. 1 is a cross-sectional view showing an example of an electrode substrate 1 of the present invention. The electrode substrate 1 shown in FIG. 1 is provided with a transparent conductive layer 11 disposed on a base substrate 10, a metal wiring layer 12 formed on this transparent conductive layer 11, and an insulating layer 14 that covers the top surface and side surfaces of this metal wiring layer 12.

As the material of the base substrate 10, it is possible to choose a glass with a strain point of 520° C. or higher, and preferably 550° C. or higher, from glasses such as borosilicate glass, soda-lime glass, glass which is made of soda lime and whose iron component is less than that of ordinary soda-lime glass, or quartz glass.

When the strain point of the material that constitutes the base substrate 10 is high, deformation and cracking of the base substrate 10 due to the heat treatment of the insulating layer 14 is hindered, and it is possible to broaden the heat treatment conditions, such as temperature, during the heat treatment of the insulating, layer 14, and the choice of materials of the insulating layer 14.

Regarding the plane size of the base substrate 10, for example, the base substrate 10 may have a width of 50 mm or more and a length of 50 mm or more. In order to obtain a practical output, it is particularly preferable that the base substrate 10 have a large area of a width of 100 mm or more and a length of 100 mm or more.

A migration prevention layer made of sodium ions or the like may be formed on the surface of the base substrate 10.

The transparent conductive layer 11 is formed on the base substrate 10 over an area that is wider than the formation area of the metal wiring layer 12. The transparent conductive layer 11 can be made to be one layer or a plurality of layers. The thickness of the transparent conductive layer 11 is preferably in a range of 0.05 to 5 μm. When the thickness of the transparent conductive layer 11 is less than 0.05 μm, compared to the transparent conductive layer 11 with a thickness of 0.05 to 5 μm, the sheet resistance becomes large, leading to a possibility of causing a decline in the photoelectric conversion efficiency. When the thickness of the transparent conductive layer 11 exceeds 5 μm, light transmittance falls remarkably, leading to a decline in photoelectric conversion efficiency.

As the material of the transparent conductive layer 11, it is possible to make a selection according to the application in consideration of light transmittance, conductivity, or the like. Specifically, it is possible to make the transparent conductive layer 11 have one layer or a plurality of layers made of a conductive metal oxide such as tin-doped indium oxide (ITO), indium oxide, tin oxide ($SnO_2$), fluorine-doped tin oxide (FTO), or antimony-doped tin oxide (ATO). Generally, tin-doped indium oxide (ITO) film, compared to fluorine-doped tin oxide (FTO) film, has excellent light transmittance and conductivity but inferior heat resistance. Moreover, a fluorine-doped tin oxide (FTO) film, compared to a tin-doped indium oxide (ITO) film, has excellent heat resistance but inferior light transmittance and conductivity. In the case of using a composite film of fluorine-doped tin oxide (FTO) and indium-tin-oxide (ITO) as the transparent conductive layer 11, an outstanding transparent conductive layer 11 is achieved in which the drawbacks of both are offset while retaining the advantages of both.

Figure 2:
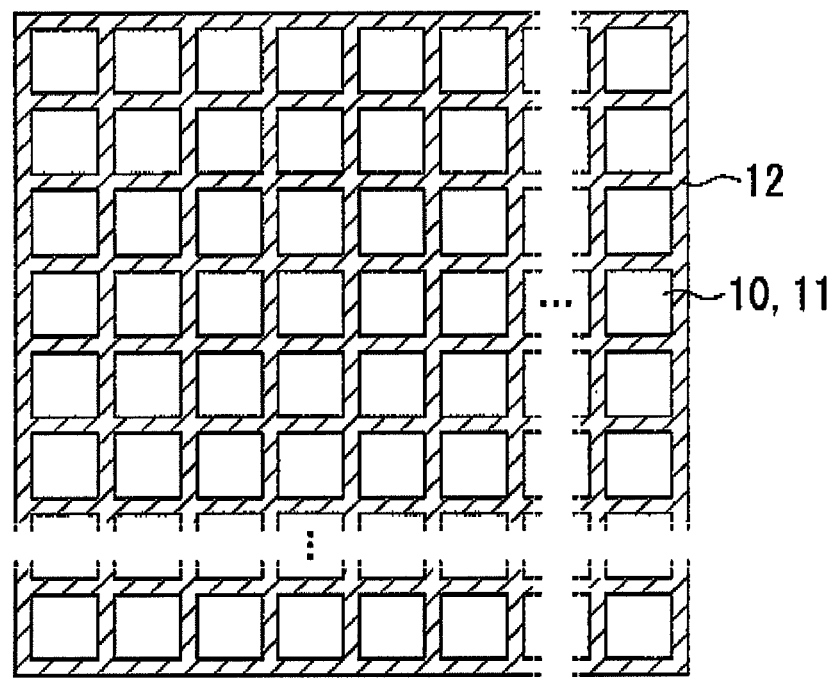
FIG. 2 is a partial plan view that shows an example of a plan shape of a metal wiring layer.

The metal wiring layer 12 is made of a metal such as gold, silver, platinum, copper, aluminum, nickel, titanium, and solder, and is formed into wire. The metal wiring layer 12 is electrically connected to the transparent conductive layer 11 and is insulated by being covered with the insulating layer 14. The pattern shape of the metal wiring layer 12 is not particularly limited, and may have a lattice pattern as shown in FIG. 2, or may have a pattern such as a stripe pattern, a band pattern, and a comb pattern. Also, the metal wiring layer 12 may be buried in a concave portion that is formed on the base substrate.

In order to not markedly impair the light transmittance of the electrode substrate 1, it is preferable that the wiring width of each wire be as thin as 1000 μm or less. The thickness (height) of each wire of the metal wiring layer 12 is not particularly limited, however, it is preferably 0.1 to 50 μm.

The surface of the metal wiring layer 12 is preferably smooth, but it is more of a priority that it have high conductivity, and it is acceptable if a small amount of protrusions or irregularities or the like are present. The specific resistance of the metal wiring layer 12 is at least $9 \times 10^{-5} \Omega \cdot cm$ or less, and more preferably $5 \times 10^{-5} \Omega \cdot cm$ or less.

The insulating layer 14 is made of low-melting glass that is capable of being sintered at 550° C. or lower, and is preferably formed by sintering at a temperature that is 20° C. or more lower than the strain point of the base substrate 10.

The insulating layer 14 is used for stabilizing the behavior of current that flows in the electrode substrate 1 in a state where the insulating layer 14 is in contact with the electrolyte solution. By the stability of the behavior of current that flows in the electrode substrate 1 in the state where the insulating layer 14 is in contact with the electrolyte solution, the denseness of the insulating layer 14 can be shown. That is, in element to arrive at the metal wiring layer 12, do not exist on the surface of the insulating layer 14. Here, stabilization means a state in which the denseness of the insulating layer 14 (described below) is evaluated as dense.

The denseness of the insulating layer 14 is evaluated in the following manner. First, an evaluation substrate with an electrode formed on the surface thereof is prepared as a counter electrode. As the evaluation substrate, for example, it is possible to use a substrate in which an electrode made of a platinum layer and FTO film is formed on a surface of a glass substrate.

This evaluation substrate and the electrode substrate 1 shown in FIG. 1 are disposed such that the electrode of the evaluation substrate faces the insulating layer 14 of the electrode substrate 1. Then, an electrolyte solution including iodine redox couples is filled between the evaluation substrate and the electrode substrate 1 such that the insulating layer 14 is immersed in the electrolyte solution including iodine redox couples. As the electrolyte solution including iodine redox couples that is used here, it is possible to use a solution that contains a redox pair consisting of iodide ions and polyiodide ions (for example, $I^-$ and $I_3^-$), such as solution in which 1,3-dialkyl imidazolium iodide salt and iodine are dissolved methoxyacetonitrile.

Then, an electric current measuring device that is capable of measuring current such as an ammeter is connected between the electrode of the evaluation substrate and the electrode substrate 1 and the current response is measured for 3 to 10 minutes. An appropriate electric potential may be applied across both electrodes. At this time, since the current response differs whether the electrolytic solution including iodine redox couples has reached to the surface of the metal wiring layer 12, it is possible to perform a judgment as to whether or not the insulating layer 14 is dense by whether or not a current is detected. The judgment as to whether or not the insulating layer 14 is dense may be performed by whether or not a current value A, which is measured using the evaluation substrate and the electrode substrate 1, is 100 times or less than a current value B, which is measured using, in place of the electrode substrate 1, an inspection substrate that is an electrode substrate in which the metal wiring layer is not provided or an electrode substrate in which the metal wiring layer and the insulating layer are not provided. In this case, it is possible to prevent errors in the judgment result based on the accuracy of the ammeter that occur in the case of judging the denseness of the insulating layer 14 by whether or not a current is detected.

The insulating layer 14 may be made of amorphous, crystalline, or composite-type low-melting glass. For example, the insulating layer 14 is formed by sintering one type or a plurality of types of low-melting glass chosen from low-melting glass that includes lead oxide such as $PbO-P_2O_5-SnF_2$ or $PbO-SiO_2-B_2O_3$ and non-lead low-melting glass.

The insulating layer 14 may be a single layer or include a plurality of layers. By having the insulating layer 14 include a plurality of layers, it is possible to more easily form the dense insulating layer 14 that has no pinholes.

In the case of forming the insulating layer 14 with a plurality of layers, it is possible to use two or more types of low-melting glass with different melting temperatures. When the insulating layer 14 includes a plurality of layers, an insulating layer made of one type of low-melting glass may be formed in a plurality of layers.

The thickness of the insulating layer 14 is not particularly limited as long as it can reliably shield the metal wiring layer 12, preferably being 10 to 100 μm at the top portion of the metal wiring layer 12 and 10 to 100 μm at the side surfaces of the metal wiring layer 12. When the thickness of the insulating layer 14 is less than the above range, there is a possibility of not being able to reliably shield the metal wiring layer 12. Also, in the case of the thickness of the insulating layer 14 exceeding the above range, when forming a photoelectric conversion element using the electrode substrate 1, the distance between the electrodes becomes longer at a portion or over the entire area of the element, which is not preferred.

The electrode substrate 1 shown in FIG. 1 can, for example, be manufactured by a manufacturing method described below.

First, the transparent conductive layer 11 is formed on the base substrate 10 over an area that is wider than the formation area of the metal wiring layer 12. As a method of forming the transparent conductive layer 11, a known appropriate method corresponding to the materials of the transparent conductive layer 11 may be adopted. For example, the sputtering method, evaporation method, SPD (spray pyrolysis deposition) method, CVD (chemical vapor deposition) method, or the like may be adopted.

Next, the metal wiring layer 12 with a pattern shape of a predetermined pattern is formed on the transparent conductive layer 11.

Examples of the method of forming the metal wiring layer 12 include a method in which a paste is prepared by mixing metal powder that is to be conductive particles as a material of the metal wiring layer 12 with a bonding agent such as fine glass particles, this paste is coated so as to form the predetermined pattern using a printing method such as a screen printing method, a metal mask method, or an inkjet method, and then the substrate is heated and sintered so as to make the conductive particles fuse. In addition, a formation method such as a sputtering method, an evaporation method, and a plating method may be used.

The electrode substrate 1 shown in FIG. 1 is obtained by forming the insulating layer 14 that covers the metal wiring layer 12. The insulating layer 14 is formed by coating a paste made of low-melting glass by a printing method or the like on a region where the metal wiring layer 12 is formed, and then sintering the paste. The sintering of the low-melting glass is preferably conducted at a heat treatment temperature that is at least 20° C. lower than the strain point of the base substrate 10. When the difference between the heat treatment temperature of the low-melting glass and the strain point of the base substrate 10 is less than 20° C., control of the heat treatment temperature becomes difficult, and so there is the possibility that variations in this heat treatment temperature leads to adverse effects such as deformation and cracking of the base substrate 10. When the difference between the heat treatment temperature of the low-melting glass and the strain point of the base substrate 10 is excessively large, the low-melting glass that can be used becomes fewer, and the choice of materials of the insulating layer 14 is narrowed.

The heat treatment temperature of the low-melting glass is adjusted to, for example, 400° C. to 550° C., and more preferably adjusted to 430° C. to 530° C. When the heat treatment temperature of the low-melting glass exceeds 550° C., there is the possibility of imparting an adverse effect on the base substrate 10. Also, when the heat treatment temperature of the low-melting glass is less than 400° C., the choice of materials of the insulating layer 14 is narrowed.

As the baking apparatus for the low-melting glass layer, it is possible to use a known suitable method. For example, it is possible to use a hot-blast circulation oven or a belt furnace.

According to the electrode substrate 1 of the present embodiment, since the insulating layer 14 is a dense layer made of low-melting glass that is sintered at a temperature lower than the strain point of the base substrate, it is possible to reliably perform shielding of the metal wiring layer by the insulating layer 14. Moreover, according to the method of manufacturing the electrode substrate 1 of the present embodiment, since the insulating layer 14 is formed by sintering low-melting glass at a temperature that is at least 20° C. lower than the strain point of the base substrate 10, deformation and cracking of the base substrate 10 is hindered and so it is possible to manufacture with a sufficient yield. Therefore, it is possible to realize the electrode substrate 1 that has a large surface area.

Also, since the insulating layer 14 is made of low-melting glass, it has excellent chemical resistance to the electrolyte solution and the like that constitutes the electrolyte layer, and so it is possible to manufacture the electrode substrate 1 with excellent durability and high reliability.

Also, since the metal wiring layer 12 is provided on the base substrate 10, the resistance of the electrode substrate 1 is low.

Hereinbelow, a modification example of an electrode substrate of the present invention will be described. In the electrode substrate of the modification example below, reference numerals the same as those in FIG. 1 denote the same or similar constitutions as the electrode substrate shown in FIG. 1, and so overlapping explanations thereof will be omitted.

Figure 3:
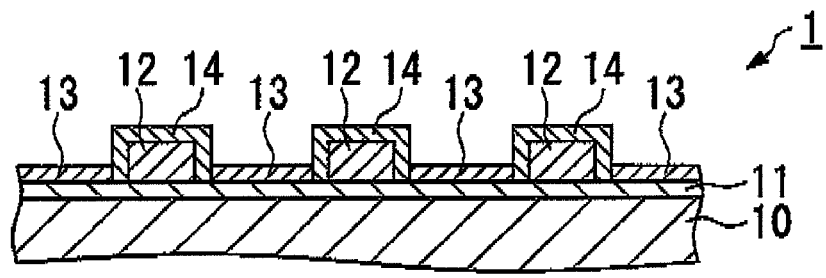
FIG. 3 is a cross-sectional view of a second example of an electrode substrate of the present invention.

The electrode substrate shown in FIG. 3 differs from the electrode substrate shown in FIG. 1 in terms of a shielding layer 13 being provided on the transparent conductive layer 11. The problems are minor compared with the metal wiring layer 12, but the leak current from the transparent conductive layer 11 has also been pointed out, so by providing the shielding layer 13 so as to cover the transparent conductive layer 11, it is possible to obtain a higher shielding effect.

As the material of the shielding layer 13, a compound having low electron transfer reaction rate with respect to an electrolyte solution that includes a redox species, high light transmittance, and high transferability of photoelectrons, is selected. For example, oxide semiconductors such as titanium oxide ($TiO_2$), a zinc oxide (ZnO), niobium oxide ($Nb_2O_5$) and tin oxide ($SnO_2$) may be used.

The shielding layer 13 must be formed thin enough not to prevent electronic transfer to the transparent conductive layer 11, and preferably has a thickness of about 1 to 1000 nm.

The method of forming the shielding layer 13 is not particularly limited, and examples thereof include a method of manufacturing an oxide semiconductor, which is the desired compound, or a precursor thereof by a dry method (i.e., gas phase method) such as a sputtering method, an evaporation method, or a CVD method. For example, when a film is formed using a precursor of a metal or the like, by oxidizing the precursor using thermal treatment or chemical treatment, it is possible to obtain the shielding layer 13. If a wet method is used, the shielding layer 13 can be obtained by applying a solution that contains the desired compound or a precursor thereof by a spin coating method, a dipping method, a blade coating method or the like, and then chemically changing the solution into the desired compound by thermal treatment or chemical treatment. Examples of the precursor include salts and complexes having constituent metallic elements of the desired compound. In order to obtain a more dense film, a solution is more preferable than a dispersion. As other methods of forming the shielding layer 13, the shielding layer 13 may be formed by, for example, using a spray pyrolysis method (SPD) such that, in a state where the base substrate 10 having the transparent conductive layer 11 is heated, a material of a precursor of the shielding layer 13 is sprayed onto the base substrate 10 so as to be pyrolyzed and changed into the desired oxide semiconductor.

In this manner, because it is possible to suppress the leak current from the transparent conductive layer 11 by providing the shielding layer 13 that shields the transparent conductive layer 11, it is possible to manufacture a photoelectric conversion element having more excellent photoelectric conversion efficiency.

In the above described embodiment, the electrode substrate 1 in which the metal wiring layer 12 was formed on the transparent conductive layer 11 was described. However, the present invention is not limited to the abovementioned embodiment and, for example, the transparent conductive layer 11 may be formed on the metal wiring layer 12 so as to cover the top surface and side surfaces of the metal wiring layer 12.

Next, the photoelectric conversion element of the present invention will be described.

Figure 4:
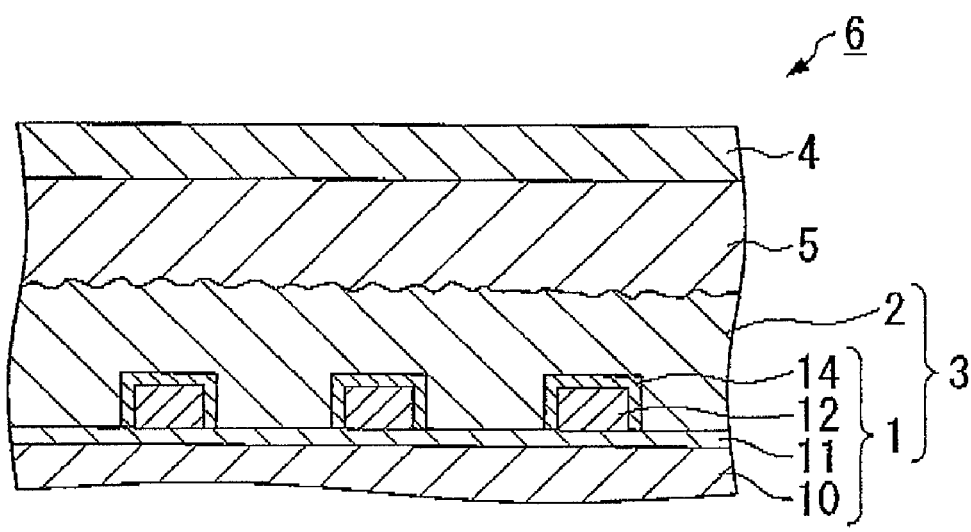
FIG. 4 is a cross-sectional view that shows an embodiment of a photoelectric conversion element of the present invention.

FIG. 4 shows an example of the photoelectric conversion element that constitutes a dye-sensitized solar cell. A photoelectric conversion element 6 is provided with a working electrode 3 having the electrode substrate 1 shown in FIG. 1 and an oxide semiconductor porous film 2 on the electrode substrate 1, and a counter electrode 4 that is provided so as to face this working electrode 3. A charge transfer layer 5 having an electrolyte such as an electrolyte solution is formed between the working electrode 3 and the counter electrode 4. In the photoelectric conversion element 6 shown in FIG. 43 the oxide semiconductor porous film 2 on which a sensitizing dye is adsorbed is formed on the surface of the electrode substrate 13 and the working electrode 3 of the photoelectric conversion element 6 is constituted by the electrode substrate 1 and the oxide semiconductor porous film 2.

Note that in FIG. 4, although the electrode substrate 1 shows the electrode substrate 1 having the constitutions shown in FIG. 1, it is not particularly limited thereto.

The oxide semiconductor porous film 2 is a porous thin film made of oxide semiconductor fine particles made of one material or more materials selected from material such as titanium oxide ($TiO_2$), tin oxide ($SnO_2$), tungsten oxide ($WO_3$), zinc oxide (ZnO), and niobium oxide ($Nb_2O_5$). The average diameter of the oxide semiconductor fine particles is preferably in a range of 1 to 1000 nm. The thickness of the oxide semiconductor porous film 2 is preferably 0.5 to 50 µm.

The method of forming the oxide semiconductor porous film 2 is not particularly limited. However, the oxide semiconductor porous film 2 can be formed, for example, by employing methods such as a method in which a fluid dispersion obtained by dispersing commercially available oxide semiconductor fine particles in a desired dispersion medium, or a colloid solution that can be prepared by a sol-gel method, is coated by a known coating method such as a screen printing method, an inkjet printing method, a roll coating method, a doctor blade method, a spin coating method, and a spray coating method. In this case, before coating, desired additives may be added to the fluid dispersion or the colloid solution, if necessary. Other methods include: a migration electrodeposition method in which the electrode substrate 1 is immersed in a colloid solution and oxide semiconductor fine particles are made to adhere to the electrode substrate 1 by electrophoresis; a method in which a foaming agent is mixed in a colloid solution or fluid dispersion, and then, they are coated and sintered so as to form a porous material; and a method in which polymer microbeads are mixed in a colloid solution or fluid dispersion, and after coating them, these polymer microbeads are removed by thermal treatment or chemical treatment, so as to define spaces and thereby form a porous material.

The sensitizing dye that is adsorbed on the oxide semiconductor porous film 2 is not particularly limited. For example, the dye may be appropriately selected from among ruthenium complexes or iron complexes with a ligand including a bipyridine structure or terpyridine structure; metal complexes based on porphyrin or phthalocyanine; and organic dyes such as coumarin, eosin, rhodamine, and merocyanine, depending on its usage and excitation behavior appropriate for the oxide semiconductor.

When the charge transfer layer 5 is made using an electrolyte, for example, an electrolyte solution such as an organic solvent or room temperature molten salt (ionic liquid) that contain a redox species may be used. It is also possible to use a gel electrolyte obtained by quasi-solidifying the aforementioned electrolyte solution by an appropriate gelling agent such as a polymer gelling agent, a low-molecular gelling agent, various nano particles, and carbon nanotubes. As the solvent for the electrolyte solution, it is possible to use an organic solvent or ionic liquid. Examples of the organic solvent include acetonitrile, methoxy acetonitrile, propionitrile, propylene carbonate, diethyl carbonate, and γ-butyrolactone. Examples of the ionic liquid include imidazolium based cations, pyrrolidinium based cations, pyridinium based cations, iodide ions, bis(trifluoromethanesulfonyl)imide anions, dicyanamide anions, and thiocyanic acid anions.

The redox pair that is contained in the electrolyte is not particularly limited, and it is possible to obtain the electrolyte by adding pairs such as iodine/iodide ions, bromine/bromide ions. As a supply source of the iodide ions or the bromide ions, it is possible to use lithium salt, quaternary imidazolium salt, or tetrabutylammonium salt, singly or in combination. Additives such as 4-tert-butylpyridine (TBP) may be added to the electrolyte, if necessary.

The counter electrode 4 may be obtained by forming an electrode made of a material that is electrochemically active with respect to the redox pair to be used, such as carbon-based material, a conductive polymer, or a metal material such as gold or platinum, on a conductive substrate such as a metal substrate, conductive glass substrate, and carbon substrate, or on a substrate made of a non-conducting material such as glass.

If the electrode is a platinum film, for example, a method of applying and heat-treating chloroplatinic acid can be adopted. It is also possible to form an electrode by the evaporation method or sputtering method.

Since the photoelectric conversion element 6 of the present embodiment has the electrode substrate 1 of the present invention in which deformation and cracking is minimal and reliability is excellent, it is possible to realize a photoelectric conversion element with a large surface area.

Also, since the photoelectric conversion element 6 of the present embodiment uses the electrode substrate 1 of the present invention with low resistance, it has excellent photoelectric conversion efficiency.

EXAMPLE 1

The electrode substrate shown in FIG. 1 was manufactured by the following procedure.

First, indium trichloride tetrahydrate and tin dichloride dihydrate are dissolved in ethanol to make a raw material solution for the ITO film. Also, a saturated water solution of ammonium fluoride was added and dissolved in an ethanol solution of tin tetrachloride pentahydrate to make a raw material solution for the FTO film. Next, the base substrate 10 made of glass A shown in Table 1 and having a dimension of 140 mm×140 mm and a thickness of 2.8 mm was placed on a heater plate to be heated. In this state, the raw material solution for the ITO film was sprayed on the base substrate 10 using a spray nozzle to form an ITO film with a film thickness of 800 nm, and then the raw material solution for the FTO film was sprayed on the base substrate 10 using a spray nozzle to form an FTO film with a film thickness of 200 nm, whereby the transparent conductive layer 11 which is a composite film of FTO and ITO and has a film thickness of 1000 nm was formed.

TABLE 1

| Example | Base substrate | Strain Point (° C.) | Insulating layer | Heat Treatment Temperature (° C.) | Strain Point-Heat Treatment Temperature (° C.) | Sintering Apparatus |
|---|---|---|---|---|---|---|
| 1 | Glass A | 583 | Low-Melting Glass A | 520 | 63 | Hot-blast Circulation Oven |
| 2 | Glass A | 583 | Low-Melting Glass A | 520 | 63 | Belt Furnace |
| 3 | Glass A | 583 | Low-Melting Glass B | 450 | 133 | Hot-blast Circulation Oven |

TABLE 1-continued

| Example | Base substrate | Strain Point (° C.) | Insulating layer | Heat Treatment Temperature (° C.) | Strain Point-Heat Treatment Temperature (° C.) | Sintering Apparatus |
|---|---|---|---|---|---|---|
| 4 | Glass B | 570 | Low-Melting Glass A | 520 | 50 | Hot-blast Circulation Oven |
| 5 | Glass B | 570 | Low-Melting Glass A | 550 | 20 | Hot-blast Circulation Oven |
| 6 | Glass C | 529 | Low-Melting Glass B | 450 | 79 | Hot-blast Circulation Oven |
| 7 | Glass D | 523 | Low-Melting Glass B | 450 | 73 | Hot-blast Circulation Oven |
| 8 | Soda-lime Glass | 510 | Low-Melting Glass A | 520 | −10 | Hot-blast Circulation Oven |
| 9 | Soda Lime Glass | 510 | Low-Melting Glass A | 520 | −10 | Belt Furnace |
| 10 | Borosilicate Glass | 529 | Low-Melting Glass A | 600 | −71 | Hot-blast Circulation Oven |
| 11 | Glass A | 583 | Low-Melting Glass A | 250 | 333 | Hot-blast Circulation Oven |
| 12 | Glass B | 570 | | 520 | 50 | Hot-blast Circulation Oven |

Note that in Table 1, Glass A refers to high strain point glass (CP600V (commercial name) manufactured by Central Glass Co.); Glass B refers to high strain point glass (PD200 (commercial name) manufactured by Asahi Glass Co.); Glass C refers to borosilicate glass (manufactured by Schott); and Glass D is white sheet glass.

Next, silver paste for printing (with a volume resistivity after sintering of $3 \times 10^{-6} \Omega$) was screen printed on the FTO film to form the metal wiring layer 12 having a silver circuit. Here, the circuit width of the metal wiring layer 12 was set to 300 μm, and the film thickness of the metal wiring layer 12 was set to 8 μm. The metal wiring layer 12 was formed in a strip shape extending from the current collection terminal. Then, the paste of low-melting glass A shown in Table 1 was overlapped with the metal wiring layer 12 while alignment was conducted with a CCD camera, and the paste of low-melting glass A was printed by screen printing. Then, the insulating layer 14 was formed by performing heat treatment so as to maintain the heat treatment temperature shown in Table 1 for 30 minutes as the holding condition of the highest temperature using the hot-blast circulation oven. The electrode substrate of Example 1 was thus obtained. Note that the aforementioned printing of the paste and the heat treatment are performed a plurality of times until the thickness of the insulating layer 14 is the predetermined thickness. The formation width of the insulating layer 14 was 700 μm while the insulating layer 14 exceeds both sides of the metal wiring layer 12 in the width direction by 200 μm in one side, and the height of the insulating layer 14 from the surface of the glass substrate was 50 μm. The thickness of the obtained insulating layer 14 from the metal wiring layer 12 was nearly the same.

EXAMPLE 2 TO EXAMPLE 11

The electrode substrates of Example 2 to Example 11 were obtained similarly to the electrode substrate 1 except for using a base substrate, an insulating layer and a sintering apparatus shown in Example 2 to Example 11 of Table 1 and adopting the heat treatment temperature shown in Example 2 to Example 11 of Table 1 (the top temperature keep time in the low-melting glass B was 15 minutes).

In each of Example 1 to Example 11, ten electrode substrates obtained in this manner were prepared, and, as shown below, the deformation of the base substrate 10, the cracking of the base substrate 10, and the density of the insulating layer 14 were investigated. The results are shown in Table 2.

TABLE 2

| Example (Electrode Substrate) | Deformed (%) | Cracked (%) | Density |
|---|---|---|---|
| 1 | 0 | 0 | Good |
| 2 | 0 | 0 | Good |
| 3 | 0 | 0 | Good |

TABLE 2-continued

| Example (Electrode Substrate) | Deformed (%) | Cracked (%) | Density |
|---|---|---|---|
| 4 | 0 | 0 | Good |
| 5 | 0 | 0 | Good |
| 6 | 0 | 0 | Good |
| 7 | 0 | 0 | Good |
| 8 | 80 | 20 | Good |
| 9 | 60 | 40 | Good |
| 10 | 100 | 0 | Good |
| 11 | 0 | 0 | Bad |

Deformation of the Base Substrate 10

The length of each of the four sides of the base substrate 10 is measured before and after the heat treatment. Among the amounts of change of the four sides, when the amount of change of at least one side is at least 100% greater than the amount of change of the other sides, or when the warpage of the base substrate is as large as at least 200% before and after the heat treatment, it is evaluated as deformation, and the percentage of the ten electrode substrates with deformation was found.

Cracking of the Base Substrate 10

Base substrates that were destroyed by cracking and base substrates in which visible cracking occurred as a result of the heat treatment are evaluated as being cracked, and the percentage of the ten electrode substrates with cracking was found.

Density of the Insulating Layer 14

The electrode substrates of Example 1 to Example 11 are disposed, in a state in which an evaluation substrate as a counter electrode, in which an electrode made of a platinum layer and an FTO layer is formed on the surface of a glass substrate, and an insulating resin sheet with a thickness of 50 μm are interposed as a spacer, so that the metal wiring layer of the electrode substrate faces the electrode of the evaluation substrate. Next, 1M of 1,3-dialkyl imidazolium iodide and 0.1M of iodine were dissolved in 1-ethyl-3-methylimidazolium bis(trifluoromethanesulfonyl)imide as an ionic liquid to form, an electrolyte solution including iodine redox couples, and the electrolyte solution including iodine redox couples was filled between the electrode substrate and the evaluation substrate, thereby immersing the insulating layer of the electrode substrate in the electrolyte solution including iodine redox couples. Then, an ammeter was connected between the electrode substrate and the evaluation substrate, and the flowing current was observed for 10 minutes.

Also, the flowing current when using an inspection substrate in which the metal wiring layer is not provided, instead of the electrode substrate of Example 2 to Example 11, was measured.

Then, it is determined whether or not the current value that was measured using the evaluation substrate and the electrode substrate is 100 times or less than the current value that is measured using the evaluation substrate and the inspection substrate, with those being 100 times or less being evaluated as density "Good" and those exceeding 100 times being evaluated as density "Bad".

From Table 2, in the electrode substrate 1 to electrode substrate 6 in which the low-melting glass that constitutes the insulating layer is sintered at a heat treatment temperature that is 20° C. or more lower than the strain point of the base substrate, it was possible to confirm that there is no deformation of the base substrate and cracking of the base substrate, and the insulating layer has excellent denseness.

From Table 2, in the electrode substrate 8 to electrode substrate 10 in which the low-melting glass that constitutes the insulating layer is sintered at a heat treatment temperature that is higher than the strain point of the base substrate, deformation of the base substrate was occurred in the electrode substrate 8 to electrode substrate 10, and cracking of the base substrate was occurred in the electrode substrate 8 and the electrode substrate 9.

Furthermore, from Table 2, in the electrode substrate 11 in which the low-melting glass that constitutes the insulating layer is sintered at a heat treatment temperature that is 333° C. lower than the strain point of the base substrate, there is no deformation of the base substrate and cracking of the base substrate, however, the insulating layer has insufficient denseness.

EXAMPLE 12

The electrode substrate of Example 12 was obtained similarly to the electrode substrate 1 except for using the base substrate shown in Example 12 of Table 1 and not providing the metal wiring layer 12 and the insulating layer 14.

EXAMPLE 13 TO EXAMPLE 20

First, a titanium oxide dispersion solution with an average particle diameter of 20 nm was coated on the electrode substrate of Example 1 to Example 7 and Example 12 by screen printing, and was dried. Then, it was sintered by being heated for one hour at 450° C., thereby forming the oxide semiconductor porous film 2. Furthermore, the oxide semiconductor porous film 2 was immersed for at least 24 hours in an ethanol solution of a ruthenium bipyridine complex (an N719 dye) so as to be sensitized with a dye. As a result, the working electrode 3 was prepared. For the counter electrode 4, an FTO glass electrode substrate in which a platinum layer was formed by sputtering was used. On the surface of the counter electrode 4, a concave portion is provided at a position in the counter electrode 4 that overlaps the wiring portion of the working electrode 3. This counter electrode 4 and the working electrode 3 were positioned so as to face each other in a state in which a thermoplastic resin sheet was interposed therebetween as a spacer. The two electrodes 3 and 4 were then fixed by heat-melting the resin sheet. At this time, a portion of the counter electrode 4 was left open in order to define an electrolyte injection aperture. The charge transfer layer 5 was formed by injecting the electrolyte solution including iodine redox couples via this injection aperture, and peripheral portions thereof and the injection aperture were fully sealed by a thermoplastic resin sheet and an epoxy based sealing resin. Then, current collecting terminal portions were formed using glass solder, thereby preparing a photoelectric conversion element of Example 13 to Example 20 for use as a test cell.

Note that in the respective photoelectric conversion elements of Example 13 to Example 20, a volatile electrolyte solution and an ionic liquid electrolyte solution were used as the electrolyte solution including iodine redox couples, respectively. The volatile electrolyte solution was manufactured by dissolving 0.5M of 1,2-dimethyl-3-propylimidazolium iodide and 0.05 M of iodine in methoxyacetonitrile, and then adding 0.1M of LiI and 0.5M of 4-tert-butylpyridine, and the ionic liquid electrolyte solution was manufactured by mixing 1-hexyl-3-methylimidazolium iodide with iodine at a molar ratio of 10:1, and then adding 0.1M of LiI and 0.5M of 4-tert-butylpyridine thereto.

The photoelectric conversion efficiency of the photoelectric conversion element of Example 13 to Example 20 obtained in this manner was evaluated using 100 mW/cm$^2$ pseudo sunlight having an air mass (AM) of 1.5. The results are shown in Table 3.

TABLE 3

| Example | Example (Electrode Substrate) | Photoelectric Conversion Efficiency (%) | |
|---|---|---|---|
| | | Volatile Electrolyte Solution | Ionic Liquid Electrolyte Solution |
| 13 | 1 | 5.3 | 3.8 |
| 14 | 2 | 5.1 | 3.7 |
| 15 | 3 | 5.1 | 4.0 |
| 16 | 4 | 5.3 | 3.7 |
| 17 | 5 | 5.0 | 3.5 |
| 18 | 6 | 4.9 | 3.7 |
| 19 | 7 | 5.2 | 4.0 |
| 20 | 12 | 0.9 | 0.4 |

From Table 3, in Example 13 to Example 19 that use an electrode substrate in which the low-melting glass that constitutes the insulating layer is sintered at a temperature that is at least 20° C. lower than the strain point of the base substrate, compared with Example 20 that uses the electrode substrate of Example 12 in which the metal wiring layer 12 and the insulating layer 14 are not provided, it was possible to confirm that excellent photoelectric conversion efficiency was obtained.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

INDUSTRIAL APPLICABILITY

The present invention relates to a manufacturing method of an electrode substrate that has a base substrate made of glass having a strain point of 520° C. or higher, a metal wiring layer, and an insulating layer made of low-melting glass that covers the metal wiring layer, the metal wiring layer and the insulating layer being provided on the base substrate, in which the insulating layer is formed by sintering a paste with heat treatment. As a result, it is possible to reliably perform shielding of the metal wiring layer with a dense low-melting glass that is sintered.

The invention claimed is:

1. A method of manufacturing an electrode substrate that has a base substrate made of glass having a strain point of 520° C. or higher, a transparent conductive layer formed on the base substrate, a metal wiring layer, and an insulating layer made of low-melting glass that covers the metal wiring layer, the metal wiring layer and the insulating layer being provided on the transparent conductive layer, the method comprising:
   a step of providing a paste that forms a base material of the low-melting glass so as to cover the metal wiring layer; and
   a step of forming the insulating layer by sintering the paste by means of a heat treatment at a temperature that is lower than the strain point of the base substrate.

2. The method of manufacturing an electrode substrate according to claim 1, wherein the heat treatment is performed at a temperature that is 20° C. or more lower than the strain point of the base substrate.

3. The method of manufacturing an electrode substrate according to claim 1, wherein the heat treatment is performed at a temperature of 400° C. to 550° C.

4. The method of manufacturing an electrode substrate according to claim 1, wherein the heat treatment is performed at a temperature of 430° C. to 530° C.

* * * * *